United States Patent
Izaki et al.

(10) Patent No.: US 8,687,152 B2
(45) Date of Patent: Apr. 1, 2014

(54) IMAGE DISPLAY DEVICE HAVING POLARIZER WITH POLARIZER PROTECTION

(75) Inventors: Akinori Izaki, Ibaraki (JP); Seiji Umemoto, Ibaraki (JP); Shouji Yamamoto, Ibaraki (JP); Kentarou Takeda, Ibaraki (JP); Mitsuru Suzuki, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 503 days.

(21) Appl. No.: 12/949,952

(22) Filed: Nov. 19, 2010

(65) Prior Publication Data

US 2011/0128477 A1 Jun. 2, 2011

(30) Foreign Application Priority Data

Nov. 27, 2009  (JP) ................. 2009-270180

(51) Int. Cl.
*G02F 1/1335* (2006.01)
(52) U.S. Cl.
USPC .............. 349/96; 349/117; 349/118; 349/119
(58) Field of Classification Search
USPC ............................................ 349/96, 117–119
See application file for complete search history.

(56) References Cited

U.S. PATENT DOCUMENTS

| 5,496,527 | A | 3/1996 | Yokogawa et al. | |
|---|---|---|---|---|
| 6,559,912 | B2 * | 5/2003 | Aminaka | 349/96 |
| 7,128,952 | B2 | 10/2006 | Murakami et al. | |
| 7,413,766 | B2 * | 8/2008 | Satake et al. | 427/162 |
| 7,504,139 | B2 * | 3/2009 | Kawanishi et al. | 428/1.54 |

| 2004/0021814 | A1 | 2/2004 | Elman et al. |
| 2004/0027520 | A1 | 2/2004 | Elman et al. |

(Continued)

FOREIGN PATENT DOCUMENTS

| JP | 2-189505 A | 7/1990 |
| JP | 8-271733 A | 10/1996 |

(Continued)

OTHER PUBLICATIONS

Korean Office Action Aug. 30, 2012 issued in Korean Patent Application No. 10-2011-7009795 (corresponding to U.S. Appl. No. 13/123,333)(9 pages). With English Translation.

Chinese Office Action dated Sep. 5, 2012, issued in corresponding Chinese Patent Application No. 200980131867.8, (10 pages). With English Translation.

Chinese Office Action dated Sep. 5, 2012, issued in Chinese Patent Application No. 201010523539.7 (issued in corresponding U.S. Appl. No. 13/123,333) (11 pages). With English Translation.

(Continued)

*Primary Examiner* — Hoan C Nguyen
(74) *Attorney, Agent, or Firm* — Westerman, Hattori, Daniels & Adrian, LLP (57) ABSTRACT

Provided is an image display device including an image display cell and a polarizing plate placed on a viewer side of the image display cell. The first polarizing plate includes a polarizer and a first protective film. The first protective film is placed on a viewer-side principal surface of the polarizer and satisfies following relations: (i) $0 \text{ nm} \leq Re_1 \leq 3000 \text{ nm}$; (ii) $Nz_1 \geq 7$; and (iii) $Rth_1 > 2500 \text{ nm}$. $Re_1$, $Rth_1$ and $Nz_1$ are defined by following equations: $Re_1 = (nx_1 - ny_1)d_1$; $Rth_1 = (nx_1 - nz_1)d_1$; and $Nz_1 = Rth_1/Re_1$, wherein $d_1$ represents a thickness of the first protective film, $nx_1$ represents a refractive index in a direction of an in-plane slow axis of the protective film, $ny_1$ represents a refractive index in a direction of an in-plane fast axis of the protective film, and $nz_1$ represents a refractive index in a direction of the thickness of the protective film.

3 Claims, 6 Drawing Sheets

(56) References Cited

U.S. PATENT DOCUMENTS

| | | |
|---|---|---|
| 2005/0206810 A1 | 9/2005 | Sasaki et al. |
| 2005/0231839 A1 | 10/2005 | Murakami et al. |
| 2007/0184212 A1 | 8/2007 | Nimura et al. |
| 2008/0239211 A1 | 10/2008 | Suzuki et al. |
| 2009/0016209 A1 | 1/2009 | Ikeda et al. |
| 2009/0141211 A1 | 6/2009 | Furuya et al. |
| 2009/0251650 A1 | 10/2009 | Fukagawa et al. |
| 2009/0297860 A1 | 12/2009 | Sasaki et al. |
| 2010/0231831 A1 | 9/2010 | Miyatake et al. |
| 2010/0309414 A1 | 12/2010 | Tomonaga et al. |
| 2011/0194048 A1* | 8/2011 | Izaki et al. ............ 349/62 |
| 2012/0229735 A1 | 9/2012 | Miyatake et al. |

FOREIGN PATENT DOCUMENTS

| | | | |
|---|---|---|---|
| JP | 2001-272538 A | 10/2001 | |
| JP | 2002-225054 A | 8/2002 | |
| JP | 2002-249599 A | 9/2002 | |
| JP | 2004-004474 A | 1/2004 | |
| JP | 2004-46133 A | 2/2004 | |
| JP | 2004-070332 A | 3/2004 | |
| JP | 2004-277524 A | 10/2004 | |
| JP | 2006-241446 A | 9/2006 | |
| JP | 2006-251294 A | 9/2006 | |
| JP | 2007-047776 A | 2/2007 | |
| JP | 2007-293316 A | 11/2007 | |
| JP | 2008-003541 A | 1/2008 | |
| JP | 2009-031746 A | 2/2009 | |
| JP | 2009-157361 A | 7/2009 | |
| JP | 2010107892 A | 5/2010 | |
| TW | 2008-39323 A | 10/2008 | |
| TW | 2009-31132 | 7/2009 | |
| WO | 2010050355 A1 | 5/2010 | |

OTHER PUBLICATIONS

Korean Notice of Allowance mailed May 20, 2012, issued in corresponding Korean Patent Application No. 10-2010-0105212 (2 pages).

Machine Translation only of JP08-271733, dated Oct. 18, 1996, previously submitted on Nov. 19, 2010 (9 pages).

Japanese Office Action dated Dec. 25, 2012, issued in corresponding Japanese patent application No. 2010-118509, w/ English translation.

Taiwanese Office Action dated Jan. 29, 2013, issued in corresponding Taiwanese patent application No. 098135109, w/ English translation.

International Search Report of PCT/JP2009/067641, mail date of Dec. 15, 2009.

Japanese Office Action dated Mar. 24, 2010, issued in corresponding Japanese Patent Application No. 2008-281998.

Notification of Transmittal of Translation of The International Preliminary Report on Patentability (Forms PCT/IB/338) of International Application No. PCT/JP2009/067641 mailed Jun. 16, 2011 with Forms PCT/IB/373 and PCT/ISA/237.

U.S. Office Action dated Jan. 18, 2013, issued in related U.S. Appl. No. 13/123,333.

U.S. Office Action dated Apr. 12, 2013, issued in related U.S. Appl. No. 13/123,333.

Korean Notice of Final Rejection dated Mar. 29, 2013, issued in corresponding Korean Patent Application No. 10-2011-7009795; with English translation (6 pages).

Japanese Office Action dated May 1, 2013, issued in corresponding Japanese Patent Application No. 2009-270180, with English translation (4 pages).

Taiwanese Office Action dated Sep. 26, 2013, issued in corresponding Taiwanese patent application No. 099137683, w/ English translation.

* cited by examiner

IMAGE DISPLAY DEVICE HAVING POLARIZER WITH POLARIZER PROTECTION

BACKGROUND OF THE INVENTION

1. Field of the Invention

The invention relates to an image display device including an image display cell and a polarizing plate placed on a viewer side of the image display cell.

2. Description of the Related Art

A liquid crystal display (LCD) has a liquid crystal panel that includes a liquid crystal cell and a polarizing plate placed on at least a viewer side of the liquid crystal cell so that it enables display by controlling an amount of transmission of light emitted from a light source or reflected light resulting from external light incident on the liquid crystal cell. As LCDs have been rapidly developed, their functions and applications tend to be diversified, and they are required to withstand more harsh environments during use. For example, LCDs for mobile applications such as cellular phones and for vehicle applications such as car navigation systems are required to have durability even to more harsh environments during use. In addition, large-sized LCDs such as LCD televisions are required to have durability to higher temperature, because as their size and brightness increase, an amount of heat from the light source increases, so that the LCDs themselves tend to have high temperature. Thus, polarizing plates for use in LCDs are also required to have less changeable properties under harsh environments such as high temperature and high humidity, namely, to have high durability.

An organic electroluminescent (EL) display device has an organic EL cell including an organic light-emitting layer and enables display by controlling an amount of luminescence from the organic EL cell. Since the organic light-emitting layer has a very small thickness such as about 10 nm, external light is reflected from a metal electrode to a viewer side, so that the display surface of the organic EL display device looks like a mirror surface, when viewed from outside. To block such specular reflection of external light, the technical method used includes placing a circularly polarizing plate including a laminate of a polarizing plate and a quarter wavelength plate on the viewer side of the organic light-emitting layer. Organic EL display devices are also required to have durability even to more harsh environments during use. Therefore, the polarizing plate placed on the viewer side is also required to have less changeable properties under harsh environments such as high temperature and high humidity, namely, to have high durability.

In general, a polarizing plate has a structure in which a polarizer is disposed between two protective films, and triacetylcellulose (TAC) is widely used for the protective films. On the other hand, in view of the durability described above, it is proposed that a film with a high level of mechanical properties, chemical resistance and water-barrier properties, such as a polyethylene terephthalate (PET) or polyethylene naphthalate (PEN) film be used as a polarizer-protective-film (see for example Japanese Patent Application Laid-Open (JP-A) No. 08-271733).

A polyester film such as a PET or PEN film is highly stretched and crystallized and therefore has a high level of mechanical properties and other properties as mentioned above. However, the polyester film has high birefringence in the in-plane direction and the thickness direction, because its intrinsic birefringence is high and is highly stretched. Therefore, when a film made of a high-birefringence material, such as a polyester film is placed as a polarizer-protective-film between a polarizer and an image display cell, polarization is distorted between the polarizer and the image display cell due to an effect of the birefringence, so that visibility may tend to be significantly reduced. From this point of view, such a polyester film is generally used as a protective film for the principal surface of the polarizer on the side not facing the image display cell.

Such a film provided to protect the principal surface of the polarizer on the side not facing the image display cell does not change the polarization between the polarizer and the image display cell. Therefore, the effect of the birefringence on the display properties is small, and the film is not necessarily required to have optical isotropy or birefringence uniformity. However, there is a problem in which when a polyester film is used as a protective film placed on the viewer side principal surface of the polarizer in a polarizing plate placed on the viewer side of an image display cell, iridescent unevenness (rainbow like unevenness) occurs to degrade visibility. Particularly, as the brightness and color purity of image display devices have increased in recent years, such iridescent unevenness becomes more likely to be visible, which becomes a hindrance to the use of a polyester film as a polarizer-protective-film.

From this point of view, it is proposed that a light scattering layer should be provided on the surface of a polarizer-protective-film so that mixing of optical paths, namely, mixing of colors can be made to make iridescent unevenness less visible. For example, JP-A No. 2008-3541 discloses that when a light scattering layer is provided on the surface of a polyester film with an in-plane retardation of 500 nm or more to form a polarizer-protective-film, such iridescent unevenness can be reduced. Such a method can make iridescent unevenness less visible but does not prevent iridescent unevenness itself, so that sufficient visibility cannot be obtained in some cases. As the brightness and color purity of image display devices further increase, the occurrence of iridescent unevenness becomes more significant. It is therefore considered that it will be difficult to ensure sufficient visibility by such a color mixing method for canceling iridescent unevenness.

SUMMARY OF THE INVENTION

An object of the invention is to provide an image display device that is prevented from suffering from iridescent unevenness, even when produced using a film with a high level of mechanical properties, chemical resistance and water-barrier properties, such as a polyester film, as a polarizer-protective-film.

The inventors have focused attention on preventing the occurrence of iridescent unevenness itself rather than cancelling the existing iridescent unevenness and have made a number of studies on principles of occurrence of iridescent unevenness. As a result, the invention has been made based on the finding that when a polarizing plate is produced using a film with predetermined optical properties as a polarizer-protective-film and placed on the viewer side of an image display cell, iridescent unevenness is prevented with no loss of the special properties of the film, such as mechanical properties, chemical resistance, or water-barrier properties.

Thus, the invention is directed to an image display device including an image display cell and a first polarizing plate placed on a viewer side of the image display cell. The first polarizing plate includes a polarizer and a first protective film.

The first protective film is placed on a viewer-side principal surface of the polarizer and satisfies following relations:

$$0 \text{ nm} \le Re_1 \le 3000 \text{ nm}; \qquad \text{(i)}$$

$$Nz_1 \ge 7; \text{ and} \qquad \text{(ii)}$$

$$Rth_1 > 2500 \text{ nm}. \qquad \text{(iii)}$$

($Re_1$, $Rth_1$ and $Nz_1$ are defined by following equations: $Re_1 = (nx_1 - ny_1)d_1$; $Rth_1 = (nx_1 - nz_1)d_1$; and $Nz_1 = Rth_1/Re_1$, wherein $d_1$ represents a thickness of the first protective film, $nx_1$ represents a refractive index in a direction of an in-plane slow axis of the protective film, $ny_1$ represents a refractive index in a direction of an in-plane fast axis of the protective film, and $nz_1$ represents a refractive index in a direction of the thickness of the protective film.)

The first protective film preferably includes aromatic polyester as a main component. More preferably, the first protective film includes polyethylene terephthalate or polyethylene naphthalate as a main component.

In the image display device of the invention, a polarizing plate having the specified optical properties is used as a polarizer-protective-film, so that iridescent unevenness can be prevented and that improved visibility can be provided.

DETAILED DESCRIPTION OF THE PREFERRED EMBODIMENTS

Outline of the Structure of Image Display Device

Figure 1A:
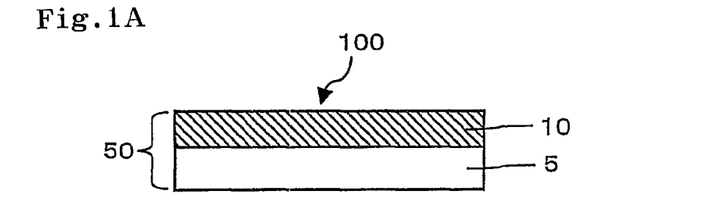
FIG. 1A is a schematic cross-sectional view of an image display device according to an embodiment of the invention.

FIG. 1A shows a schematic cross-sectional view of an image display device according to an embodiment of the invention. An image display device 100 has an image display panel 50 including an image display cell 5 and a first polarizing plate 10 provided on the viewer side of the cell 5. The image display cell 5 used may be a liquid crystal cell or an organic electroluminescent (EL) cell.

The liquid crystal cell to be used may be any one of a reflective liquid crystal cell that operates using external light, a transmissive liquid crystal cell that operates using light from a light source such as a backlight, and a transflective liquid crystal cell that operates using both external light and light from a light source. Any driving mode such as VA mode, IPS mode, TN mode, STN mode, or bend alignment (n) mode may be used for the liquid crystal cell.

Figure 1B:
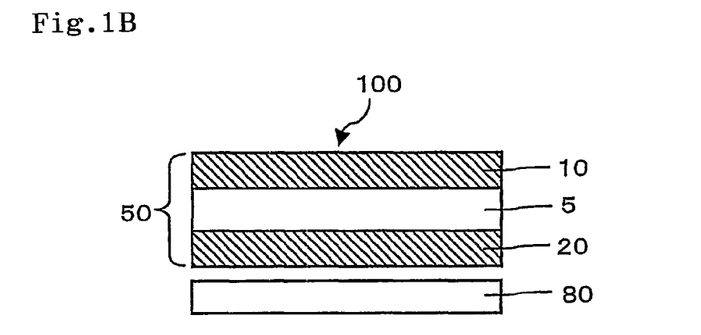
FIG. 1B is a schematic cross-sectional view of an image display device according to another embodiment of the invention.

When the liquid crystal cell used is a transmissive or transflective liquid crystal cell, the liquid crystal panel 50 further includes, as shown in FIG. 1B, a second polarizing plate 20 provided on the opposite side of the liquid crystal cell 5 from the viewer side, and the liquid crystal display device 100 includes a light source 80.

The organic EL cell to be used may be a light-emitting device (organic electroluminescent light-emitting device) including a transparent substrate, and a transparent electrode, an organic light-emitting layer, and a metal electrode that are placed in this order on the substrate. The organic light-emitting layer may be a laminate of different organic thin films, such as a laminate of a hole injection layer of a triphenylamine derivative or the like and a light-emitting layer of an organic fluorescent solid such as anthracene, a laminate of such a light-emitting layer and an electron injection layer of a perylene derivative or the like, or a laminate of the hole injection layer, the light-emitting layer and the electron injection layer. Concerning such a laminate, structures having various combinations are known.

First Polarizing Plate

Figure 2A:
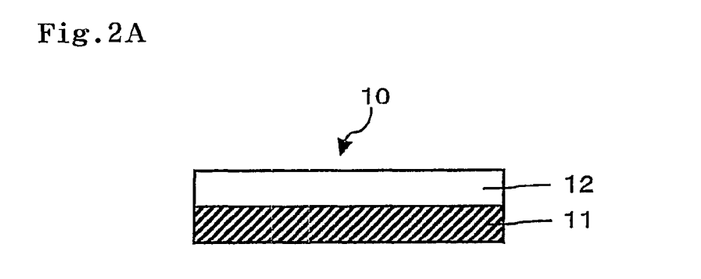
FIG. 2A is a schematic cross-sectional view showing a polarizing plate for use in an image display device according to an embodiment of the invention.
Figure 2B:
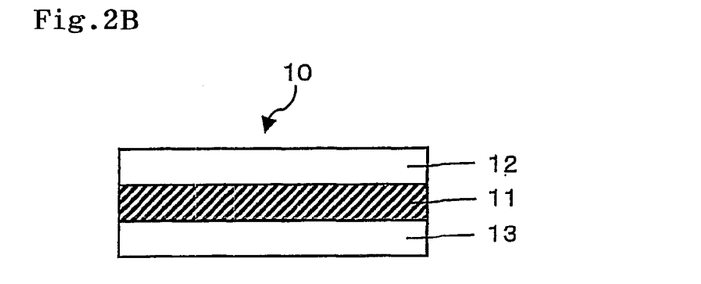
FIG. 2B is a schematic cross-sectional view showing a polarizing plate for use in an image display device according to another embodiment of the invention.

The first polarizing plate 10 is placed on the viewer side of the image display cell 5. As shown in FIG. 2A, the first polarizing plate 10 includes a polarizer 11 and a first protective film 12 provided on one principal surface of the polarizer 11. In the image display device of the invention, the first polarizing plate is placed so that the first protective film 12 is placed on the viewer side of the polarizer 11. As shown in FIG. 2B, the polarizing plate 10 generally has a second protective film 13 provided on the opposite side principal surface of the polarizer 11 from the surface on which the first protective film is provided, namely, provided on the image display cell 5 side of the polarizer 11. In an embodiment of the invention, however, such a second protective film may be omitted.

Polarizer

The polarizer 11 may be a film capable of converting natural light or polarized light into the desired polarized light. Although, an appropriate arbitrary polarizer may be used, a polarizer that converts natural light or polarized light into linearly polarized light is preferably used. As a polarizer, for example, a film that is uniaxially stretched after having dichroic materials, such as iodine and dichromatic dye, absorbed to hydrophilic polymer films, such as polyvinyl alcohol-based film, partially formalized polyvinyl alcohol-based film, and ethylene-vinyl acetate copolymer-based partially saponified film; polyene-based alignment films, such as dehydrated polyvinyl alcohol and dehydrochlorinated polyvinyl chloride, etc. may be mentioned. Alternatively, the polarizer may be an O-type polarizer in which a liquid crystalline composition containing a dichroic material and a liquid crystalline compound is oriented in a certain direction as disclosed in U.S. Pat. No. 5,523,863 or may be an E-type polarizer in which a lyotropic liquid crystal is oriented in a certain direction as disclosed in U.S. Pat. No. 6,049,428.

Among such polarizers, a polarizer comprising a polyvinyl alcohol-based film containing iodine is preferably used, because it has a high degree of polarization and high-adherent to a polarizer-protective-film.

First Protective Film

Materials

A film with good mechanical properties is preferably used as the first protective film 12 provided on the viewer side of the polarizer 11. For example, such a film with good mechanical properties preferably includes a (semi)crystalline material as a main component. Typically, it preferably includes polyester as a main component. When the crystallization of polyester is allowed to proceed by heating or the like, its mechanical strength, dimensional stability or heat resistance can be increased with increasing the crystallinity. Therefore, use of polyester for a polarizer-protective-film makes it possible to improve the mechanical strength or heat durability of the polarizing plate. As compared with triacetylcellulose (TAC) widely used for conventional polarizer-protective-films, polyester has high gas-barrier properties and particularly low water vapor permeability. Thus, use of polyester for a polarizer-protective-film makes it possible to improve the humidity resistance of the polarizing plate.

For example, the polyester may be a polyester resin selected from homopolymers obtained by polycondensation of one dicarboxylic acid and one diol, copolymers obtained by polycondensation of one or more dicarboxylic acids and two or more diols, or copolymers obtained by polycondensation of two or more dicarboxylic acids and one or more diols, and a resin blend containing two or more of the homopolymers or copolymers, in which examples of one or more dicarboxylic acids include terephthalic acid, isophthalic acid, orthophthalic acid, 2,5-naphthalenedicarboxylic acid, 2,6-naphthalenedicarboxylic acid, 1,4-naphthalenedicarboxylic acid, 1,5-naphthalenedicarboxylic acid, diphenylcarboxylic acid, diphenoxyethanedicarboxylic acid, diphenylsulfonecarboxylic acid, anthracenedicarboxylic acid, 1,3-cyclopentanedicarboxylic acid, 1,3-cyclohexanedicarboxylic acid, 1,4-cyclohexanedicarboxylic acid, hexahydroterephthalic acid, hexahydroisophthalic acid, malonic acid, dimethylmalonic acid, succinic acid, 3,3-diethylsuccinic acid, glutaric acid, 2,2-dimethylglutaric acid, adipic acid, 2-methyladipic acid, trimethyladipic acid, pimelic acid, azelaic acid, dimer acid, sebacic acid, suberic acid, and dodecadicarboxylic acid, and examples of one or more diols include ethylene glycol, propylene glycol, hexamethylene glycol, neopentyl glycol, 1,2-cyclohexanedimethanol, 1,4-cyclohexanedimethanol, decamethylene glycol, 1,3-propanediol, 1,4-butanediol, 1,5-pentanediol, 1,6-hexanediol, 2,2-bis(4-hydroxyphenyl)propane, and bis(4-hydroxyphenyl)sulfone. In particular, aromatic polyester is preferred, because of its crystallinity, and in particular, polyethylene terephthalate (PET) or polyethylene naphthalate (PEN) is preferably used.

For example, a polyester film may be obtained by a method including melt-extruding the polyester resin into a film-shape melt and cooling and solidifying the melt in a casting drum to form a film. In an embodiment of the invention, a stretched polyester film, in particular, a biaxially-stretched polyester film is preferably used in order that crystallinity may be imparted to the polyester film to achieve the properties described above. When the first protective film used includes aromatic polyester as a main component, the film may contain any other resin than aromatic polyester, an additive, or any other material. The term "includes aromatic polyester as a main component" means that the film contains 50% by weight or more, preferably 60% by weight or more, more preferably 70% by weight or more, even more preferably 80% by weight or more of aromatic polyester, based on the total weight of the film.

To form a stretched film for use as the first protective film, any type of stretching method may be used, such as longitudinal uniaxial stretching, transverse uniaxial stretching, sequential biaxial (longitudinal and transverse) stretching, or simultaneous biaxial (longitudinal and transverse) stretching. As mentioned above, biaxial stretching is preferably used. Stretching means may be any appropriate stretching machine such as a roll stretching machine, a tenter stretching machine, or a pantograph- or linear motor-type biaxial stretching machine.

Retardation Properties

The first protective film has a thickness $d_1$, a refractive index $nx_1$ in the direction of its in-plane slow axis, a refractive index $ny_1$ in the direction of its in-plane fast axis, a refractive index $nz_1$ in the direction of its thickness, an in-plane retardation $Re_1$ defined by $Re_1=(nx_1-ny_1)d_1$, a thickness direction retardation $Rth_1$ defined by $Rth_1=(nx_1-nz_1)d_1$, and an $Nz_1$ value defined by $Nz_1=Rth_1/Re_1$, wherein $Re_1$, $Rth_1$ and $Nz_1$ satisfy the following relations: (i) $0 \text{ nm} \leq Re_1 \leq 3{,}000 \text{ nm}$; (ii) $Nz_1 \geq 7$; and (iii) $Rth_1 > 2{,}500 \text{ nm}$.

The image display device of the invention is characterized in that it has the retardation properties described above, so that it is prevented from suffering from iridescent unevenness, even when a high-birefringence material such as a crystalline polyester film is used as the protective film 12 on the viewer side of the first polarizing plate 10, which is the viewer side polarizing plate. In the conventional art, use of polyester films has been limited due to the effect of iridescent unevenness by their high birefringence, although it has been proposed that they should be used for polarizer-protective-films, because of their high mechanical strength and other properties and their relatively low cost. The invention has been made based on the new finding that when a polyester film having optical properties in the specified range is used, iridescent unevenness can be prevented without losing the advantage of the polyester film.

According to the relation (i), the first protective film has an in-plane retardation $Re_1$ of 3,000 nm or less. If the in-plane retardation is too high, iridescent unevenness may tend to significantly occur. Therefore, it is preferred that $Re_1$ be relatively low. Specifically, $Re_1$ is preferably 2,000 nm or less, more preferably 1,000 nm or less, even more preferably 450 nm or less, particularly preferably 400 nm or less, most preferably 350 nm or less. Iridescent unevenness will tend to be reduced as the in-plane retardation further decreases. Therefore, $Re_1$ does not particularly have a lower limit. On the other hand, in order that the in-plane retardation of a film including, as a main component, a high-intrinsic-birefringence material such as aromatic polyester may be adjusted to a low level, the stretch ratio should be kept low, or the thickness of the film should be reduced, which may tend to make it difficult to improve the mechanical strength of the film. It is not impossible to reduce the in-plane retardation by highly controlling the stretching process, but in such a case, the polyester film may tend to be expensive. In view of these points and the productivity of the film, $Re_1$ should generally be 10 nm or more, preferably 30 nm or more, more preferably 50 nm or more.

According to the relation (ii), the $Nz_1$ of the first protective film, namely, the ratio of the thickness direction retardation $Rth_1$ to the in-plane retardation $Re_1$ is 7 or more. Iridescent unevenness will tend to be reduced as Nz increases. Therefore, $Nz_1$ is preferably relatively high, specifically, preferably 10 or more, more preferably 12 or more. While the Nz value is uniquely determined by the values of the in-plane retardation $Re_1$ and the $Rth_1$, its upper limit is theoretically infinite (in the case that $Re_1=0$). Therefore, the Nz value does not particularly have an upper limit in the realizable range.

According to the relation (iii), the first protective film has a thickness direction retardation $Rth_1$ of more than 2,500 nm. When the thickness direction retardation is larger than the in-plane retardation, the $Nz_1$ value becomes larger, so that iridescent unevenness will tend to be reduced. An increase in the thickness direction retardation correlates with an increase in the degree of in-plane orientation of molecules in the film. In the polyester film, therefore, an increase in the molecular orientation tends to promote the crystallization. Also in view of the mechanical strength or dimensional stability of the film, therefore, it is preferred that $Rth_1$ be relatively high. $Rth_1$ is preferably 4,000 nm or more, more preferably 5,000 nm or more, even more preferably 6,000 nm or more, still more preferably 7,000 nm or more, most preferably 8,000 nm or more. On the other hand, a further increase in $Rth_1$ needs an increase in the thickness of the film. The increase in the film thickness may tend to increase the cost or the thickness of the polarizing plate or the image display device. From these points of view, $Rth_1$ is preferably 16,000 nm or less, more preferably 15,000 nm or less, even more preferably 14,000 nm or less.

Thickness

While the first protective film may have any thickness as long as it has retardation properties according to the relations (i), (ii) and (iii), it preferably has a thickness of 10 to 200 µm, more preferably 15 to 150 µm, even more preferably 20 to 100 µm. If the thickness of the film is too small, the film may have insufficient mechanical properties or low handleability, so that its function as a polarizer-protective-film may be insufficient. If the thickness of the film is too large, it may be difficult to keep the in-plane retardation at low level, or the cost may tend to increase.

Other Properties

The thickness direction retardation $Rth_1$ is expressed by the product of the thickness $d_1$ and the difference between the refractive index $nx_1$ in the direction of the in-plane slow axis of the film and the refractive index $nz_1$ in the direction of the thickness of the film, namely, the birefringence $(nx_1-nz_1)$ in the thickness direction. The birefringence $(nx_1-nz_1)$ in the thickness direction correlates with the degree of in-plane orientation of molecules in the film. Specifically, the larger $(nx_1-nz_1)$ indicates the higher degree of in-plane orientation of molecules and the enhanced degree of crystallinity, which means that the film strength tends to be high. Contrarily, if $(nx_1-nz_1)$ is small, the film strength may tend to be low. Mechanical strength should be imparted to the first protective film so that it can be practically useful as a polarizer-protective-film, while the image display device is prevented from suffering from iridescent unevenness. In addition, the thickness of the film should be reduced so that an increase in the cost and thickness of the image display device can be suppressed. From these points of view, it is preferred that $(nx_1-nz_1)$ be relatively large. Specifically, $(nx_1-nz_1)$ is preferably 0.04 or more, more preferably 0.06 or more. On the other hand, $(nx_1-nz_1)$ does not exceed the intrinsic birefringence value, which means that it may have a natural upper limit. For example, therefore, the $(nx_1-nz_1)$ value of a polyethylene terephthalate film is generally 0.25 or less, preferably 0.20 or less.

The haze of the first protective film is preferably less than 25%, more preferably less than 10%, even more preferably less than 5%. If the haze of the first protective film placed on the viewer side is too high, back scattering of light emitted from the image display cell may increase, so that the brightness of the image display device may tend to be low. On the other hand, when the haze of the first protective film is kept in the above range, back scattering-induced loss of light can be prevented, so that the brightness of the image display device can be kept high. The first protective film to be used may further include an easy-adhesion layer for improving the adhesion to the polarizer, or any of various surface treatments such as anti-reflection, antiglare, and hard-coating treatments or a surface treatment layer may be performed or provided on the side of the first protective film where the polarizer is not bonded, namely, on the viewer side of the first protective film, before use.

Principles of Elimination of Iridescent Unevenness

Presumed principles are described below concerning prevention of iridescent unevenness in the image display device including the first protective film having the optical properties described above.

Principles of Occurrence of Iridescent Unevenness

Figure 3A:
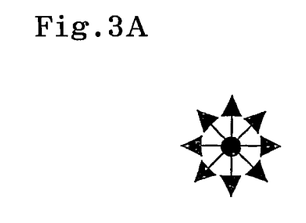
FIGS. 3A, 3B, 3C, and 3D are diagram conceptually showing natural light, polarized light having a vibration plane in the drawing plane, polarized light having a vibration plane in a plane perpendicular to the drawing plane, and elliptically polarized light, respectively.
Figure 3B:
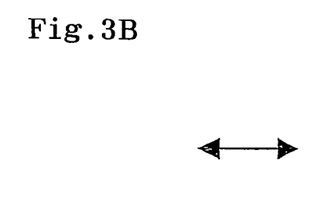
Figure 3C:
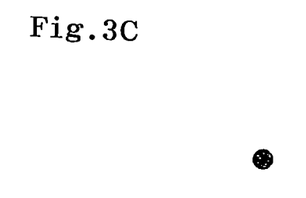
Figure 3D:
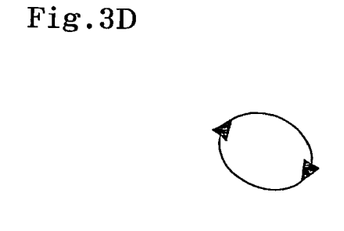

FIGS. 3A to 3D are diagrams schematically showing polarization states, in which FIG. 3A shows natural light, FIG. 3B shows polarized light having a vibration plane in the drawing plane, FIG. 3C shows polarized light having a vibration plane in a plane perpendicular to the drawing plane, and FIG. 3D shows elliptically polarized light.

Figure 4:
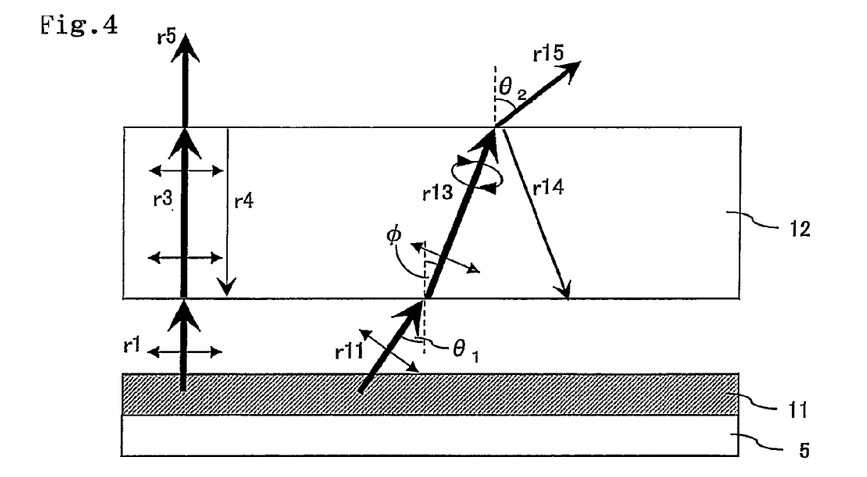
FIG. 4 is a schematic diagram for illustrating how the polarization state changes when the light exits from an image display cell, transmits through a polarizer and a first protective film, and exits to the viewer side.

FIG. 4 schematically shows that light enters the surface (corresponding to the drawing plane) of the image display cell 5, exits in a specific polarization state from the cell 5, is absorbed into the polarizer 11 having a transmission axis in the drawing plane direction and an absorption axis perpendicular thereto, exits as linearly polarized light having a vibration direction in the drawing plane from the polarizer, transmits through the first protective film 12, and exits to the viewer side. It will be understood that when light enters the first protective film 12 from the polarizer 11, reflection occurs at the interface, but such reflection at the interface is not shown in the drawings.

FIG. 4 and FIGS. 5A, 5B, 6, 7A, and 7B (described below) show transmitted or reflected light having a single polarized component. These drawings are diagrams for schematically illustrating principles according to the invention and do not indicate that the light actually has only a single polarized component.

When the in-plane retardation $Re_1$ of the first protective film 12 is substantially zero or when the direction of the slow axis of the first protective film is parallel or perpendicular to the direction of polarization of linearly polarized light r1 (namely, the direction of the transmission axis of the polarizer 11), linearly polarized light r1 exiting from the polarizer 11 and only containing a p-polarized component capable of transmitting in the normal direction of the film surface (namely, the normal direction of the screen of the image display device) reaches, as linearly polarized light r3, the viewer side interface of the first protective film without being influenced by birefringence during the transmission through the first protective film.

Part of the transmitted light r3 is reflected from the viewer side interface of the first protective film to the polarizer 11 to form reflected light r4, and the remaining part exits as exiting light r5 to the viewer side. In this process, the p-polarized light of the transmitted light r3 is reflected at a reflectivity of $\{(n_1-n_2)/(n_1+n_2)\}^2$ to form the reflected light r4, wherein $n_1$ is the refractive index of the first protective film, and $n_2$ is the refractive index of the viewer side medium.

On the other hand, linearly polarized light r11 obliquely incident at an angle $\theta_1$ onto the first protective film 12 from the polarizer 11 is influenced by the birefringence during the transmission through the first protective film 12, so that its polarization state is changed. Thus, light r13 transmitting through the first protective film is converted into elliptically polarized light containing p- and s-polarized components in a specific ratio, when it reaches the viewer side interface of the first protective film.

Part of the light r13 reaching, at an angle $\phi$, the viewer side interface of the fist protective film is reflected to the polarizer 11 to form reflected light r14, and the remaining part exits as exiting light r15 at an angle $\theta_2$ to the viewer side. In this process, the reflectivities $R_p$ and $R_s$ of the p- and s-polarized components reflected to form reflected light r14 are expressed by the Fresnel formulae below, respectively.

$$R_p = \{\tan(\phi-\theta_2)/\tan(\phi+\theta_2)\}^2 \quad \text{(formula 1)}$$

$$R_s = \{\sin(\phi-\theta_2)/\sin(\phi+\theta_2)\}^2 \quad \text{(formula 2)}$$

In the formulae, $\phi$ and $\theta_2$ follow Snell's law as shown below with respect to the refractive index $n_1$ of the first protective film 12 (transmission side medium) and the refractive index $n_2$ of the exit side medium.

$$n_1 \sin\phi = n_2 \sin\theta_2 \quad \text{(formula 3)}$$

Also, as is evident from the above Snell's law, the reflectivity of s-polarized light is higher than that of p-polarized light, with respect to light transmitting in an oblique direction. Therefore, as the s-polarized component of the light r13 reaching the viewer side interface of the first protective film increases, the reflectivity at the interface increases, and the intensity of the light r15 exiting to the viewer side decreases.

Not only polyester but any substances have so-called "wavelength dispersion" so that their refractive indices vary with wavelength. Thus, the refraction angle $\phi$ varies with wavelength with respect to the light obliquely incident at an angle $\theta_1$ onto the first protective film 12 from the polarizer 11.

Figure 5A:
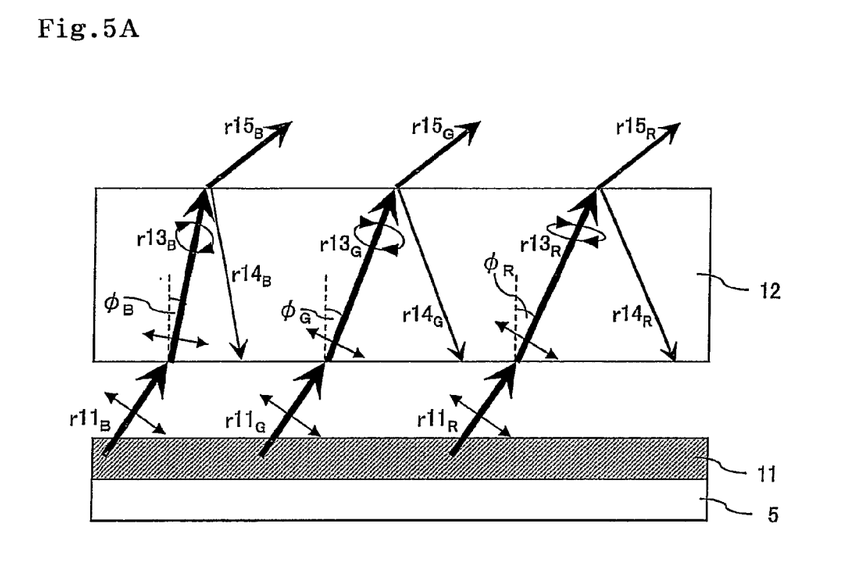
FIG. 5A is a schematic diagram for illustrating that the variation of polarization state changes with wavelength, when the light exits from the image display cell, transmits through the polarizer and the first protective film, and exits to the viewer side.

For example, as schematically shown in FIG. 5A, when linearly polarized light r11 enters the first protective film 12, blue light transmits as light $r13_B$ at a refraction angle $\phi_B$, green light transmits as light $r13_G$ at a refraction angle $\phi_G$, and red light transmits as light $r13_R$ at a refraction angle $\phi_R$. In general, the shorter the wavelength, the larger the refractive index. Therefore, the refraction angles have the relation: $\phi_B < \phi_G < \phi_R$. In addition, birefringence also has wavelength dispersion, and therefore, the retardation which the light r13 transmitting through the first protective film undergoes also varies with wavelength. Thus, blue light $r13_B$, green light $r13_G$ and red light $r13_R$ have different polarization states (different p-polarized component/s-polarized component ratios), when they reach the viewer side interface.

As described above, the p-polarized component/s-polarized component ratio varies with the wavelength of light reaching the viewer side interface of the first protective film, and therefore, the reflectivity (r14/r13) at the viewer side interface also varies with wavelength. As a result, the intensity of the light r15 exiting to the viewer side also varies with wavelength, as schematically represented by $r15_B$, $r15_G$ and $r15_R$ in FIG. 5A. Thus, when a film having high refractive index and high birefringence is used as the protective film, the effect of the refractive index and birefringence of the protective film makes a significant difference between the spectral shape of the light r15 exiting from the first protective film to the viewer side and the spectral shape of the light r11 entering the first protective film 12 from the polarizer 11, so that coloring occurs.

In particular, a polyester film has a refractive index of about 1.60, which is higher than that of a TAC film (about 1.43 in refractive index) widely used as a polarizer-protective-film in conventional arts. Biaxial stretching further increases the birefringence. Therefore, when a high-refractive-index film such as a polyester film is used as the first protective film, the difference between the reflectivities of s-polarized light and p-polarized light becomes large, so that the difference between the spectral shape of the light r11 incident on the protective film and the spectral shape of the light r15 exiting from the protective film tends to be large.

The coloring generated by the principle described above is called "chromatic polarization." Particularly when the first protective film has an apparent retardation of approximately 350 nm or more, coloring tends to occur due to such chromatic polarization.

While presumed principles of occurrence of iridescent unevenness due to chromatic polarization of light exiting from the image display cell 5 have been described above, it is also considered that iridescent unevenness may occur due to chromatic polarization even when external light enters the image display device and enters the first protective film 12 and is reflected. Presumed principles thereof are described below.

Figure 6:
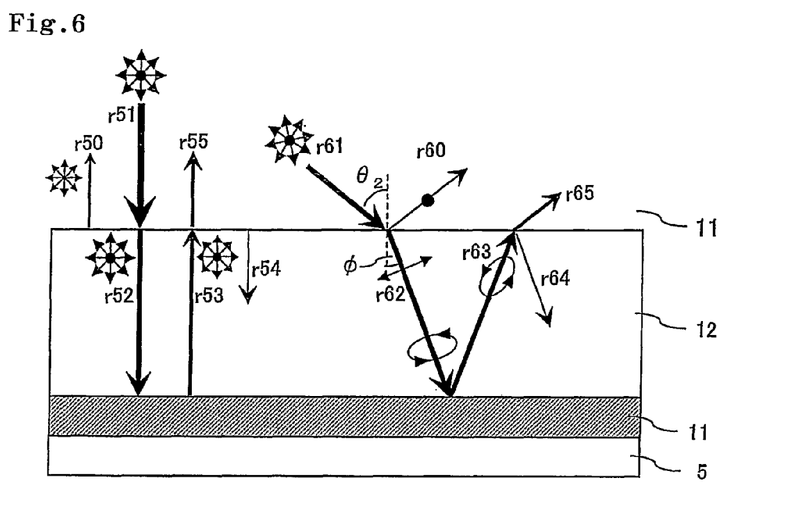
FIG. 6 is a schematic diagram for illustrating how the polarization state changes when external light enters the first protective film from the viewer side, transmits through the first protective film, is reflected at the interface with the polarizer 11, and exits to the viewer side again.

FIG. 6 schematically shows that external light from the viewer side enters the first protective film 12, transmits through the first protective film, is reflected at the interface with the polarizer 11, and exits to the viewer side again. Part of natural light r51 incident in the normal direction of the screen of the image display device onto the first protective film 12 from the viewer side is reflected at the viewer side interface of the first protective film 12 and returns as natural light r50 to the viewer side. On the other hand, most of light r52 that enters the first protective film without being reflected at the interface transmits through the first protective film with maintaining the non-polarized state and reaches the interface with the polarizer 11, and part of it is reflected to form reflected light r53. Most of the reflected light r53 transmits through the first protective film with maintaining the non-polarized state, and part of it is reflected from the viewer side interface of the first protective film to the polarizer side again to form reflected light r54. The remaining part exits as exiting light r55 to the viewer side.

On the other hand, part of natural light r61 obliquely incident at an angle $\theta_2$ onto the first protective film 12 from the viewer side returns from the interface of the first protective film to the viewer side to form reflected light r60, and the remaining part enters, as incident light r62, the fist protective film. In this process, the reflected light r60 and the incident light r62 are partially divided into p-polarized light and s-polarized light to form partially polarized light. In this case, the reflectivity $R_s$ of the s-polarized light is higher than the reflectivity $R_p$ of the p-polarized light as described above. Therefore, the light r62, which transmits through the first protective film without being reflected at the viewer side interface of the first protective film, forms "p-polarized component-rich" partially polarized light in which the intensity of the p-polarized component is higher than that of the s-polarized component. Particularly, when a film with high-refractive-index material such as a polyester film is used as the first protective film 12, the light r62 transmitting through the first protective film forms partially polarized light with richer p-polarized component.

The polarization of the p-polarized component-rich, partially polarized light r62 is changed by the effect of the birefringence of the protective film during the transmission through the first protective film 12. The polarization state of light r63 reflected at the interface with the polarizer 11 is also changed, so that it is partially converted into a different polarization state (mainly elliptical polarization) when the light reaches the viewer side from the first protective film 12.

Figure 7A:
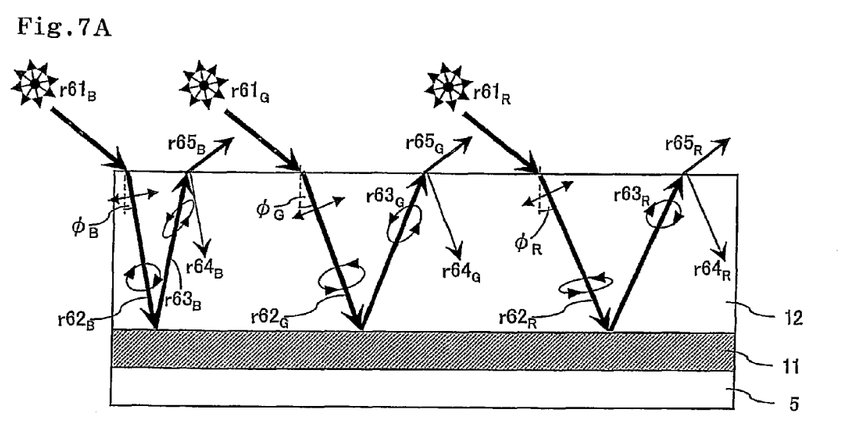
FIG. 7A is a schematic diagram for illustrating that the variation of polarization state changes with wavelength, when external light enters the first protective film from the viewer side, transmits through the first protective film, is reflected at the interface with the polarizer 11, and exits to the viewer side again.

As in the above case of light exiting from the image display cell, the light is influenced by the refractive index and birefringence wavelength dispersion of the first protective film. As shown in FIG. 7A, therefore, blue light $r63_B$, green light $r63_G$ and red light $r63_R$ have different polarization states (different p-polarized component/s-polarized component ratios), when they reach the viewer side interface. Thus, the intensity of light r65 exiting to the viewer side also varies with wavelength, as schematically represented by $r65_B$, $r65_G$ and $r65_R$ in FIG. 5A, so that coloring occurs due to chromatic polarization.

By the way, the first protective film has three-dimensional, refractive-index anisotropy, and therefore, its apparent retardation varies with viewing angle. In addition, due to the three-dimensional, refractive-index anisotropy, the apparent slow-axis direction of the first protective film 12 also varies with viewing angle. Therefore, the spectrum of light r15 and light r65 exiting to the viewer side varies with the viewing angle $\theta_2$, so that coloring caused by chromatic polarization varies with the viewing angle. The angular variation of the coloring is observed as iridescent unevenness by the viewer's eyes. As the viewing angle $\theta_2$ increases, the absolute value of the amount of change of the apparent retardation $Re(\theta_2)$ of the first protective film per unit amount of angular change, namely, $|dRe(\theta_2)/d\theta_2|$ increases. Therefore, as the viewing angle $\theta_2$ increases, the change of the coloring caused by the angular variation increases, so that iridescent unevenness tends to be more easily observed. In particular, iridescent unevenness is more likely to be significant around the Brewster's angle at which the difference between the reflectivities of p-polarized light and s-polarized light becomes the maximum.

As described above, it is concluded that when a polyester film having high refractive index and high birefringence is used as the first protective film 12, the viewer side interface of the first protective film acts as a polarizer to separate s-polarized light and p-polarized light, so that iridescent unevenness occurs due to chromatic polarization.

Principles of Elimination of Iridescent Unevenness

In order to prevent the coloring caused by such chromatic polarization, a low-birefringence material may be used for the first protective film 12 so that the variation of the polarization state caused by the birefringence of the first protective film can be reduced. On the other hand, polyester films have a problem in which when they are unstretched and have low birefringence, their mechanical strength is not enough to show the special properties of the polyester material. To show the special properties of a polyester film, stretching is essential. Therefore, it would be substantially impossible to reduce the apparent retardation of a polyester film to less than 350 nm at all viewing angles, if the polyester film is produced so as to have such a thickness and a mechanical strength that it can function as a polarizer-protective-film.

In light of the principles of occurrence of iridescent unevenness, the invention has been made based on the finding that when the in-plane retardation $Re_1$ of the first protective film is kept low according to the relation (i) and when the $Nz_1$ value is kept high according to the relation (ii), iridescent unevenness resulting from chromatic polarization can be prevented even though the thickness retardation $Rth_1$ is set high according to the relation (iii).

A film having an in-plane retardation of approximately zero and a certain level of thickness direction retardation (e.g., about 100 nm or more) is generally called "C-plate." It is known that when light is obliquely incident on such a C-plate, the apparent slow axis direction makes an azimuth angle of 90° with the viewing angle direction. The direction at an azimuth angle of 90° with respect to the viewing angle is coincident with the vibration direction of s-polarized light. Concerning light transmitting through a C-plate, therefore, the apparent slow axis direction falls within the vibration plane of the s-polarized light. Likewise, the apparent fast axis direction of the C-plate falls within the vibration plane of the p-polarized light.

Figure 5B:
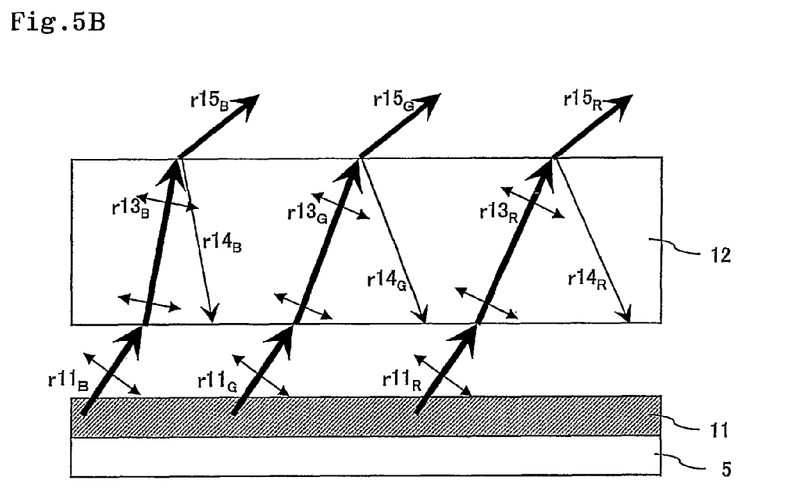
FIG. 5B is a schematic diagram for illustrating that the variation of polarization state changes with wavelength is eliminated using a C-plate as the first protective film, when light exits from the image display cell, transmits through the polarizer and the first protective film, and exits to the viewer side.
Figure 7B:
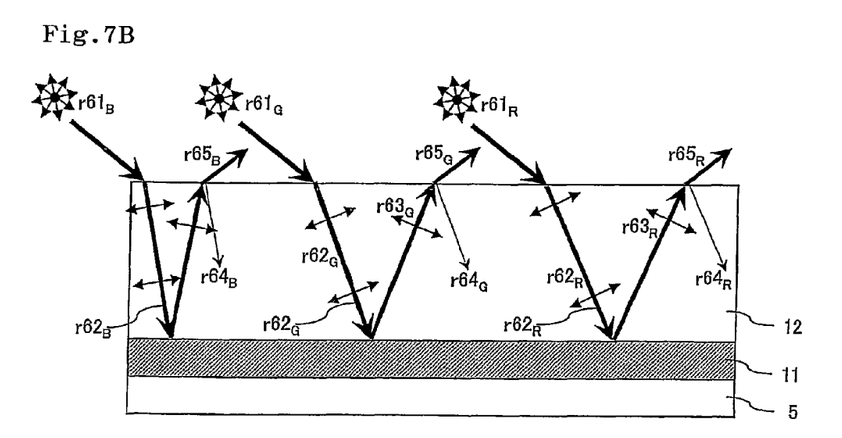
FIG. 7B is a schematic diagram for illustrating that the variation of polarization state changes with wavelength can be eliminated, when external light enters the first protective film from the viewer side, transmits through the first protective film, is reflected at the interface with the polarizer 11, and exits to the viewer side again.

Therefore, when the first protective film is a C-plate, the light transmitting through the first protective film 12 is not influenced by birefringence, so that its polarization state is not substantially changed, as schematically represented by light $r13_B$, $r13_G$ and $r13_R$ in FIG. 5B and light $r62_B$, $r63_B$, $r62_G$, $r63_G$, $r62_R$, and $r63_R$ in FIG. 7B. Thus, even when the thickness direction retardation $Rth_1$ is high, chromatic polarization-induced coloring does not occur, so that iridescent unevenness also does not occur.

From these points, it is apparent that the in-plane retardation $Re_1$ of the first protective film should preferably be reduced so that iridescent unevenness can be suppressed. On the other hand, iridescent unevenness is significant when the viewing angle $\theta_2$ is large. In such a range, therefore, if the apparent slow axis direction of the first protective film behaves substantially in the same manner as the C-plate, iridescent unevenness will be prevented. Thus, $Nz_1$ is preferably large, so that the apparent slow axis direction can behave substantially in the same manner as the C-plate when the viewing angle $\theta_2$ is large.

As described above, chromatic polarization-induced iridescent unevenness does not significantly occur around the normal direction where the viewing angle $\theta_2$ is relatively small, as compared with the region where the viewing angle $\theta_2$ is large. However, large-screen image display devices such as large-screen televisions and information displays are more frequently viewed from directions oblique to the screen, namely, from regions where the viewing angle $\theta_2$ is large. As the viewing angle $\theta_2$ increases, the reflectivity increases, so that the effect of reflection and polarization of external light as shown in FIG. 7A also increases. In an embodiment of the invention, $Nz_1$ is typically as high as 7 or more even when the first protective film has a certain level of in-plane retardation $Re_1$. Therefore, in the range where the viewing angle $\theta_2$ is large, the apparent slow-axis direction of the first protective film can behave substantially in the same manner as a C-plate. Thus, when $Re_1$, $Rth_1$ and $Nz_1$ are each in the specified range, iridescent unevenness is not observed according to the principles schematically shown in FIGS. 5B and 7B. The relations (i), (ii) and (iii) indicates such an acceptable retardation range. The examples described below demonstrate that iridescent unevenness is suppressed in such a range.

Second Protective Film

As shown in FIG. 2B, the first polarizing plate 10 may have a second protective film 13. In this case, while the material and optical properties of the second protective film are not particularly restricted, the second protective film is preferably produced with an optically-isotropic material having substantially no birefringence or a material that has high in-plane uniformity of retardation value or high in-plane uniformity of the optical axis direction, even when it has birefringence, because the second protective film is placed between the polarizer 11 and the image display cell 5. A retardation film (optical compensation layer) may also be used as the second protective film.

Materials

In an embodiment of the invention, materials for the second protective film in the polarizing plate preferably include, but are not limited to, transparent polymers having uniform optical properties as mentioned above. Particularly in view of transparency (low haze), amorphous polymers are preferably used. From these points of view, examples of materials for the second protective film include cellulose resins, cyclic polyolefin resins (norbornene resins), polycarbonate resins, polyarylate resins, amorphous polyester resins, polyvinyl alcohol resins, polysulfone resins, and polyimide resins.

Oriented liquid crystal polymer layers may also be used instead of the above polymer films or formed on the above polymer films. Examples of the liquid crystal polymer include various main-chain or side-chain types having a liquid crystal molecular orientation property-imparting conjugated linear atomic group (mesogen) introduced in a main or side chain of a polymer. Examples of the main chain type liquid crystal polymer include polymers having a mesogen group bonded thereto via a flexibility-imparting spacer moiety, such as nematically ordered polyester liquid-crystalline polymers, discotic polymers, and cholesteric polymers. For example, the side-chain type liquid crystal polymer may be a polymer comprising: a main chain skeleton of polysiloxane, polyacrylate, polymethacrylate, or polymalonate; and a side chain having a mesogen moiety that comprises a nematic orientation-imparting para-substituted cyclic compound unit and is bonded thereto via a spacer moiety comprising a conjugated atomic group.

Retardation Properties

The second protective film may be optically isotropic and have substantially no birefringence. In this case, a film having an in-plane retardation $Re_2$ of less than 40 nm and a thickness direction retardation $Rth_2$ of less than 80 nm may be used as the second protective film. Such a protective film having good optical isotropy is preferably an unstretched film. The in-plane retardation $Re_2$ and thickness direction retardation $Rth_2$ of the second protective film are determined from the thickness $d_2$, the refractive index $nx_2$ in the direction of the in-plane slow axis, the refractive index $ny_2$ in the direction of the in-plane fast axis, and the refractive index $nz_2$ in the direction of the thickness in the same manner as described above for the first protective film.

Alternatively, a film having an in-plane retardation of 40 nm or more and/or a thickness direction retardation of 80 nm or more may be used as the second protective film, so that it can also serves as a retardation film. In this case, the in-plane retardation or the thickness direction retardation of the second protective film may be appropriately adjusted to the value necessary for a retardation film served as optical compensator. A stretched film is preferably used as the retardation film. The retardation film to be used may be selected from films satisfying the relation: $nx_2=ny_2>nz_2$, $nx_2>ny_2>nz_2$, $nx_2>ny_2=nz_2$, $nx_2>nz_2>ny_2$, $nz_2=nx_2>ny_2$, $nz_2>nx_2>ny_2$, or $nz_2>nx_2=ny_2$, depending on various applications. The relation $ny_2=nz_2$ is intended to include not only the case where $ny_2$ is completely equal to $nz_2$ but also the case where $ny_2$ is substantially equal to $nz_2$. When the image display cell 5 is an organic EL cell, the second protective film 13 may have an in-plane retardation $Re_2$ of ¼ wavelength (approximately 100 to 170 nm), so that the first polarizing plate can function as a circularly polarizing plate and can also block specular reflection of external light.

Thickness

The second protective film preferably has a thickness of 5 to 500 μm, more preferably 5 to 200 μm, even more preferably 10 to 150 μm. If the thickness is below the range, the film may be more likely to break, so that a strength problem may occur when it is used in the polarizing plate or it may have insufficient water-barrier properties, which may degrade the durability of the polarizer. If the thickness is above the range, the film may lack flexibility, so that the handleability of the film may be low or it may be difficult to manufacture the film.

Haze

The haze of the second protective film is preferably 2% or less, more preferably 1% or less. If the haze of the second protective film is high, the polarization state or directivity of the light constantly polarized by the polarizer may be non-uniformly changed by scattering, so that the contrast of the image display device may be reduced.

Formation of First Polarizing Plate

The first polarizing plate 10 is formed by laminating the polarizer 11 and the first protective film 12 and optionally the second protective film 13. The polarizer and the protective film may be laminated by any method. In view of workability and light use efficiency, the polarizer and the protective film are preferably laminated with an adhesive or pressure-sensitive adhesive layer interposed therebetween so that no air gap will be created. When an adhesive or pressure-sensitive adhesive layer is used, any of various types of adhesive or pressure-sensitive adhesives may be used.

Particularly to increase the adhesion between the polarizer and the protective film, an adhesive layer is preferably used in the lamination of them. For example, the adhesive to be used in the formation of an adhesive layer may be appropriately selected from adhesives containing, as a base polymer, an acryl-based polymer, a silicone-based polymer, polyester, polyurethane, polyamide, polyvinyl ether, a vinyl acetate-vinyl chloride copolymer, modified polyolefin, an epoxy-based polymer, a fluoropolymer, or a rubber polymer such as a natural rubber polymer or a synthetic rubber polymer. In particular, an aqueous adhesive is preferably used in the lamination of the polarizer and an optically-isotropic film. An adhesive containing a polyvinyl alcohol-based resin as a main component is particularly used.

Examples of polyvinyl alcohol-based resin for use in the adhesive include polyvinyl alcohol resin and acetoacetyl group-containing polyvinyl alcohol resin. Acetoacetyl group-containing polyvinyl alcohol resin is preferably used to improve the durability of the polarizing plate, because it can form a polyvinyl alcohol-based adhesive having a highly reactive functional group. In order to prevent defective irregularities (knicks), it is also preferred that a metal colloid be added to the adhesive as described in JP-A No. 2008-15483.

Before the adhesive or pressure-sensitive adhesive is applied, the protective film may be subjected to a surface modification treatment such as hydrophilization for adhesion improvement or any other purpose. Examples of such a treatment include a corona treatment, a plasma treatment, a primer treatment, and a saponification treatment.

Arrangement Angle

The angular relation between the first protective film and the polarizer is not particularly restricted. In order to prevent iridescent unevenness, the direction of the slow axis of the first protective film 12 is preferably substantially parallel or perpendicular to the direction of the absorption axis of the polarizer 11. When they are arranged parallel or perpendicular to each other, iridescent unevenness can be prevented even when the first protective film has an in-plane retardation $Re_1$ of 350 nm or more. The term "substantially parallel or perpendicular" means that the angle between them is not only 0° or 90° but also in the range of 0° or 90°±15°, preferably ±12°, more preferably ±10°. When the first protective film is "substantially a C-plate," for example, which has a small in-plane retardation $Re_1$ of 100 nm or less, preferably 50 nm or less, the effect of the arrangement angle on the development of iridescent unevenness is small.

Arrangement on the Viewer Side of Image Display Cell

The image display panel 50 is formed by placing the first polarizing plate 10 on the viewer side of the image display cell 5. As shown in FIG. 1B, if necessary, the second polarizing plate 20 may be placed on the opposite side of the image display cell 5 from the viewer side. Any known appropriate polarizing plate may be used as the second polarizing plate 20. Any of various optical layers such as an optical compensation film may be provided between the image display cell 5 and the polarizing plate 10 or 20.

Formation of Image Display Panel

A method of placing the polarizing plate on the image display cell preferably includes laminating them with a pressure-sensitive adhesive layer. For example, the pressure-sensitive adhesive to be used in the formation of the pressure-sensitive adhesive layer may be appropriately selected from, but not limited to, pressure-sensitive adhesives containing, as a base polymer, an acryl-based polymer, a silicone-based polymer, polyester, polyurethane, polyamide, polyether, a fluoropolymer, or a rubber polymer. In particular, preferably used is a pressure-sensitive adhesive having a high level of transparency, weather resistance and heat resistance and exhibiting an appropriate degree of wettability, cohesiveness and tackiness, such as an acrylic pressure-sensitive adhesive. In addition, a pressure-sensitive adhesive layer may be placed as a superimposed layer of different composition or types.

In view of workability in the process of laminating the image display cell and the polarizing plate, the pressure-sensitive adhesive layer is preferably formed in advance on one or both of the polarizing plate and the image display cell. The thickness of the pressure-sensitive adhesive layer may be appropriately determined depending on the intended use, the adhesive strength or the like. The thickness of the pressure-sensitive adhesive layer is generally from 1 to 500 μm, preferably from 5 to 200 μm, particularly preferably from 10 to 100 μm.

A release sheet (separator) may be temporary attached to an exposed side of a pressure-sensitive adhesive layer to prevent contamination etc., until it is practically used. Thereby, it can be prevented that foreign matter contacts pressure-sensitive adhesive layer in usual handling. As a release sheet, suitable conventional sheet materials that is coated, if necessary, with release agents, such as silicone type, long chain alkyl type, fluorine type release agents, and molybdenum sulfide may be used. As a suitable sheet material, plastics films, rubber sheets, papers, cloths, no woven fabrics, nets, foamed sheets and metallic foils or laminated sheets thereof may be used.

Formation of Image Display Device

The image display device of the invention may be obtained, if necessary, by further incorporating the light source 80, a driving circuit, or other optional components into the image display panel 50. Besides these components, various components necessary for the formation of the image display device may be used in combination.

The image display device obtained as described above may be used in various applications including OA equipment such as personal computer monitors, notebook computers, and copy machines; portable equipment such as cellular phones, watches, digital cameras, personal digital assistances (PDAs), and portable game machines; domestic electrical equipment such as video cameras, televisions, and microwave ovens; vehicle equipment such as back monitors, monitors for car navigation systems, and car audios; display equipment such as information monitors for stores; alarm systems such as surveillance monitors; and care and medical equipment such as care monitors and medical monitors.

EXAMPLES

The invention is further described by the Examples of transmissive liquid crystal display below, which are not intended to limit the scope of the invention. The Examples, Reference Examples and Comparative Examples below were evaluated by the methods described below.

Measurement and Evaluation Methods

Retardation

The in-plane retardation was measured under an environment at 23° C. using a polarization/retardation measurement system (AxoScan (product name) manufactured by Axometrics, Inc.) at a measurement wavelength of 590 nm. In addition, the film was inclined by 40° around the slow axis direction and the fast axis direction as a rotation center, and then the retardation was measured under the same conditions. The order of the measured retardation value was determined so as to agree with the wavelength dispersion of the retardation of a polyester film determined in advance.

The in-plane retardation, the thickness direction retardation and Nz were calculated from these measured valued.

Evaluation of Iridescent Unevenness

In a darkroom at 23° C., a white image was displayed on the liquid crystal display, and whether or not iridescent coloring was present on the screen was checked by visual observation, while the polar angle was changed between 40° and 70° at an azimuth angle of about 15° using the absorption axis direction of the viewer-side polarizing plate as a reference azimuth angle. The iridescent unevenness was rated on a scale of 1 to 4 as shown below.

1: The hue significantly varies as the angle changes.
2: The hue significantly varies in an angular range where the polar angle is between about 40° and 60°, which is narrower than that in the case of a scale of 1.
3: The hue significantly varies in an angular range where the polar angle is between about 40° and 50°, which is narrower than that in the case of a scale of 2.
4: Almost no variation of the hue is observed as the angle changes.

Example 1

Preparation of Polyester Film

A 200 μm thick unstretched polyethylene terephthalate film (amorphous) was subjected to free-end uniaxial stretching (longitudinal stretching) in the machine direction for the manufacture of it at a stretch ratio of 2.8 times and then subjected to fixed-end uniaxial stretching (transverse stretching) in the width direction at a stretch ratio of 2.9 times using a tenter stretching machine, so that a crystalline polyester film was obtained. This polyester film was named "protective film A."

Formation of Easy-Adhesion Layer on the Polyester Film

The surface of the protective film A was subjected to a corona treatment. A polyester-based, aqueous dispersion urethane adhesive (SUPERFLEX SF210 (trade name) manufactured by DAI-ICHI KOGYO SEIYAKU CO., LTD.) was then applied to the protective film A using a coating tester equipped with a #200 mesh gravure roll. The coating was dried at 150° C. for 1 minute, so that a 0.3 µm thick easy-adhesion layer was formed on the film.

Preparation of Polarizer

A polyvinyl alcohol film with an average degree of polymerization of 2,700 and a thickness of 75 µm was stretched and fed, while it was dyed between rolls having different peripheral speeds. First, the polyvinyl alcohol film was stretched to 1.2 times in the feed direction, while it was allowed to swell by immersion in a water bath at 30° C. for 1 minute. Thereafter, the film was stretched in the feed direction to 3 times the original length of the unstretched film, while it was dyed by immersion in an aqueous solution at 30° C. containing 0.03% by weight of potassium iodide and 0.3% by weight of iodine for 1 minute. The film was then stretched to 6 times the original length in the feed direction, while it was immersed for 30 seconds in an aqueous solution at 60° C. containing 4% by weight of boric acid and 5% by weight of potassium iodide. The resulting stretched film was then dried at 70° C. for 2 minutes to give a polarizer. The polarizer had a thickness of 30 µm and a water content of 14.3% by weight.

Preparation of Adhesive

Under the condition of a temperature of 30° C., 100 parts by weight of an acetoacetyl group-containing polyvinyl alcohol resin (1,200 in average degree of polymerization, 98.5% by mole in degree of saponification, 5% by mole in degree of acetoacetylation) and 50 parts by weight of methylol melamine were dissolved in pure water to form an aqueous solution with a solids content of 3.7% by weight. An aqueous adhesive solution containing colloidal metal was prepared by adding, to 100 parts by weight of the aqueous solution, 18 parts by weight of an aqueous solution containing positively-charged colloidal alumina (15 nm in average particle size) at a solid concentration of 10% by weight. The adhesive solution had a viscosity of 9.6 mPa·s and a pH in the range of 4 to 4.5. The amount of the colloidal alumina was 74 parts by weight, based on 100 parts by weight of the polyvinyl alcohol resin. The average particle size of the colloidal alumina was measured with a particle size distribution meter (Nanotrack UPA150, manufactured by Nikkiso Co., Ltd.) by dynamic light scattering method (optical correlation technique).

Preparation of Polarizing Plate

The adhesive was applied to the surface of the polarizer so that an 80 nm thick adhesive layer could be formed after drying, and the protective film A with easy-adhesion layer was laminated to one of the principal surfaces of the polarizer, while a retardation film (WVBZ (trade name) manufactured by Fujifilm Corporation) made of a cellulose-based resin, serving as both of optical compensation layer and a polarizer-protective film, was laminated to the other principal surface of the polarizer. Lamination of the films was performed by roller laminator. The resulting laminate was dried at 70° C. for 6 minutes, so that a polarizing plate was obtained. The lamination of the protective film A to the polarizer was performed in such a manner that the easy-adhesion-layer-side surface of the protective film A faced the polarizer. The resulting polarizing plate having optical compensation layer was named "polarizing plate A".

Polarizing Plate on Light Source Side

A commercially available polarizing plate (NPF VEGQ1724DU (trade name) manufactured by NITTO DENKO CORPORATION) having a polarizer and a retardation film placed on one side of the polarizer was used as a light source-side polarizing plate. This commercially available polarizing plate was composed of a polarizer made of an iodine-containing, polyvinyl alcohol-based film, a retardation film (WVBZ (trade name) manufactured by Fujifilm Corporation) made of a cellulose-based resin and placed on one principal surface of the polarizer (the polarizer surface to be placed on the liquid crystal cell side), and a triacetylcellulose film placed on the other principal surface, which were laminated with an adhesive layer interposed therebetween. This polarizing plate was named "polarizing plate X".

Preparation of Liquid Crystal Panel

The liquid crystal panel was taken out from a liquid crystal television (LC32-D30 (trade name) manufactured by SHARP CORPORATION) equipped with a VA-mode liquid crystal cell and a direct-type backlight. The polarizing plate and the optical compensation film placed on the upper and lower sides of the liquid crystal cell were removed from the panel, and the glass surfaces (front and back) of the liquid crystal cell were cleaned. Subsequently, the polarizing plate A was placed on the viewer-side surface of the liquid crystal cell with an acrylic pressure-sensitive adhesive interposed therebetween so that it was in the same direction as the absorption axis of the light source-side polarizing plate that had been placed in the original liquid crystal panel and that the protective film A side of the polarizing plate A was placed on the viewer side.

The polarizing plate X was then placed on the light source-side surface of the liquid crystal cell with an acrylic pressure-sensitive adhesive interposed therebetween so that it was in the same direction as the absorption axis of the viewer-side polarizing plate that had been placed in the original liquid crystal panel and that the optical compensation layer-side surface of the polarizing plate X faced the liquid crystal cell. As a result, a liquid crystal panel was obtained, which had the liquid crystal cell, the polarizing plate A placed on the viewer-side principal surface of the cell, and the polarizing plate X placed on the light source-side principal surface of the cell.

Preparation of Liquid Crystal Display

The resulting liquid crystal panel was incorporated into the original liquid crystal display. Thirty minutes after the light source of the liquid crystal display was turned on, whether or not iridescent unevenness occurred was visually evaluated.

Examples 2 to 5 and Comparative Examples 1 to 6

Preparation of Polyester Films

Crystalline polyester films with different retardation properties were prepared using the process of manufacturing the polyester film in Example 1, except that the longitudinal stretch ratio and the transverse stretch ratio were changed as shown in Table 1. The resulting polyester films were named "protective films B, C, D, E, F, G, H, I, and J", respectively. The polyethylene terephthalate film (amorphous) obtained before the stretching in the process of manufacturing the polyester film in Example 1 was named "protective film K".

Preparation of Polarizing Plates

The adhesion-facilitating layer was formed on each polyester film as in Example 1, except that each of the protective films B to K was used in place of the protective film A, and a polarizing plate was prepared using each resulting product. The resulting polarizing plates were named "polarizing plates B, C, D, E, F, G, H, I, J, and K."

Formation of Liquid Crystal Panels

A liquid crystal panel was obtained as in Example 1, except that each of the polarizing plates B to K was used in place of the polarizing plate A. As a result, liquid crystal panels were obtained, in which each of the polarizing plates B to K was placed on the viewer-side principal surface of the liquid crystal cell, and the polarizing plate X was placed on the light source-side principal surface of the cell.

Preparation of Liquid Crystal Display

Each of the resulting liquid crystal panels was incorporated into the original liquid crystal display. Thirty minutes after the light source of the liquid crystal display was turned on, whether or not iridescent unevenness occurred was visually evaluated.

Figure 8:
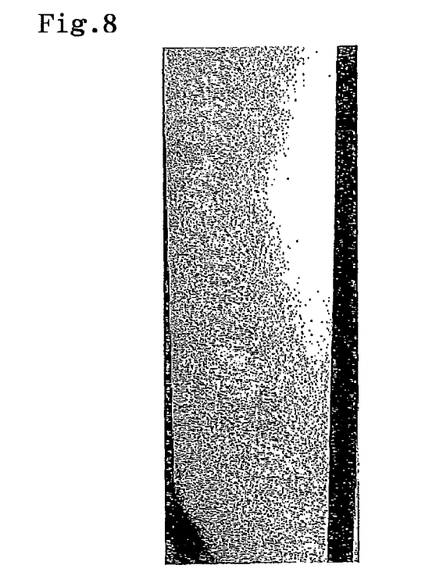
FIG. 8 is a photograph showing the display state when the image display device of Example 1 is obliquely viewed.
Figure 9:
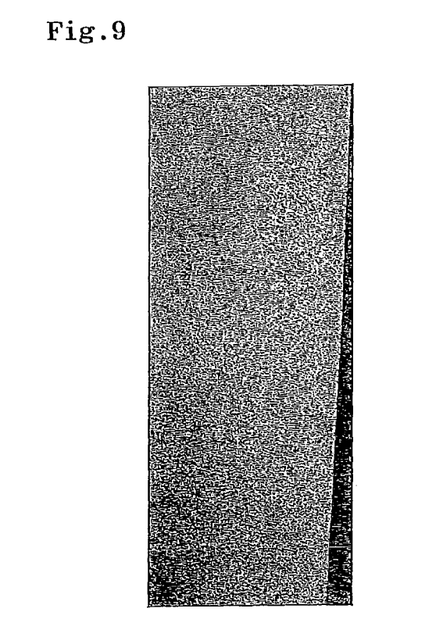
FIG. 9 is a photograph showing the display state when the image display device of Comparative Example 1 is obliquely viewed.

Table 1 shows the results of the evaluation of iridescent unevenness in the liquid crystal displays obtained in the Examples and the Comparative Examples together with the retardation properties of each protective film. FIGS. 8 and 9 (photographs) each show the display state when each of the liquid crystal displays obtained in Example 1 and Comparative Example 1 was obliquely viewed (in the direction at an azimuth angle of about 15° and a polar angle of about 60° with respect to the absorption axis direction of the viewer-side polarizing plate).

TABLE 1

| | Viewer-side polarizing plate | | | | | | |
|---|---|---|---|---|---|---|---|
| | Polarizing plate type | Stretch ratio | | Optical properties of protective film | | | Iridescent unevenness |
| | | Longitudinal direction | Transverse direction | Re | Rth | NZ | |
| Example 1 | A | 2.8 | 2.9 | 500 | 6800 | 13.6 | 4 |
| Example 2 | B | 2.8 | 3.1 | 590 | 4570 | 7.7 | 3 |
| Example 3 | C | 2.8 | 3.2 | 620 | 4340 | 7.0 | 3 |
| Example 4 | D | 2.8 | 3.0 | 520 | 5200 | 10.0 | 4 |
| Example 5 | E | 2.6 | 2.5 | 450 | 3500 | 7.8 | 3 |
| Comparative Example 1 | F | 2.5 | 4.0 | 3070 | 8500 | 2.8 | 1 |
| Comparative Example 2 | G | 2.5 | 3.4 | 1100 | 6500 | 5.9 | 2 |
| Comparative Example 3 | H | 3.3 | 3.5 | 1800 | 7400 | 4.1 | 1 |
| Comparative Example 4 | I | 2.0 | 2.5 | 2000 | 4000 | 2.0 | 1 |
| Comparative Example 5 | J | 2.2 | 2.1 | 200 | 1100 | 5.5 | 2 |
| Comparative Example 6 | K | 0 | 0 | 10 | 240 | 24 | 3 |

When the screen of the liquid crystal display of Comparative Example 1 was obliquely viewed (FIG. 8), rainbow-like coloring was observed (reddish and greenish portions were alternately observed on the screen from the upper side to the lower side of the photograph). In the Examples, however, such coloring was not observed, which showed that uniform display was obtained.

As is evident from Table 1, iridescent unevenness is suppressed in the liquid crystal display of each Example in which the in-plane retardation, the thickness direction retardation and Nz of the first protective film are each in the specified range, as compared with the liquid crystal displays of Comparative Examples 1 to 5. It is also apparent that in the Examples, as the Nz of the first protective film increases, the occurrence of iridescent unevenness is more suppressed. In Comparative Example 6 where an unstretched polyester film (protective film K) was used, the protective film had a low thickness direction retardation and a low level of mechanical strength and chemical resistance, although iridescent unevenness tended to be suppressed.

What is claimed is:

1. An image display device, comprising:
   an image display cell; and
   a first polarizing plate placed on a viewer side of the image display cell,
   wherein the first polarizing plate comprises a polarizer and a first protective film,
   wherein the first protective film is placed on a viewer-side principal surface of the polarizer and satisfies following relations:

$350 \text{ nm} \leq Re_1 \leq 3000 \text{ nm}$; (i)

$Nz_1 \geq 7$; and (ii)

$Rth_1 > 2500 \text{ nm}$, (iii)

wherein $Re_1$, $Rth_1$ and $Nz_1$ are defined by following equations:

$Re_1 = (nx_1 - ny_1)d_1$;

$Rth_1 = (nx_1 - nz_1)d_1$; and $Nz_1 = Rth_1/Re_1$, wherein $d_1$ represents a thickness of the first protective film, $nx_1$ represents a refractive index in a direction of an in-plane slow axis of the protective film, $ny_1$ represents a refractive index in a direction of an in-plane fast axis of the protective film, and $nz_1$ represents a refractive index in a direction of the thickness of the protective film.

2. The image display device according to claim 1, wherein the first protective film comprises aromatic polyester as a main component.

3. The image display device according to claim 2, wherein the aromatic polyester is polyethylene terephthalate or polyethylene naphthalate.

* * * * *